(12) United States Patent
Huang et al.

(10) Patent No.: US 6,700,202 B2
(45) Date of Patent: Mar. 2, 2004

(54) SEMICONDUCTOR DEVICE HAVING REDUCED OXIDATION INTERFACE

(75) Inventors: Judy H. Huang, Los Gatos, CA (US); Christopher Dennis Bencher, Sunnyvale, CA (US); Sudha Rathi, San Jose, CA (US); Christopher S. Ngai, Burlingame, CA (US); Bok Hoen Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/013,182

(22) Filed: Dec. 7, 2001

(65) Prior Publication Data

US 2002/0081856 A1 Jun. 27, 2002

Related U.S. Application Data

(60) Division of application No. 09/365,129, filed on Jul. 30, 1999, which is a continuation-in-part of application No. 09/193,920, filed on Nov. 17, 1998.

(51) Int. Cl.$^7$ ................................ H01L 23/48
(52) U.S. Cl. ........................ 257/762; 438/622
(58) Field of Search ................ 438/622, 624–627, 438/629–631, 633–637, 712, 714, 722, 725; 257/635–636, 640, 647–648, 750–751, 762–764

(56) References Cited

U.S. PATENT DOCUMENTS

| 4,308,089 A | 12/1981 | Iida et al. ............... 156/643 |
| 4,420,386 A | 12/1983 | White ..................... 204/192 |
| 4,436,761 A | 3/1984 | Hayashi et al. ............ 427/38 |
| 4,980,196 A | 12/1990 | Yasuda et al. ............. 427/38 |
| 4,994,410 A | 2/1991 | Sun et al. ................ 437/192 |
| 5,000,113 A | 3/1991 | Wang et al. .............. 118/723 |
| 5,121,706 A | 6/1992 | Nichols et al. ............ 118/719 |
| 5,135,775 A | 8/1992 | Foller et al. .............. 427/38 |
| 5,232,871 A | 8/1993 | Ho ........................ 437/190 |

(List continued on next page.)

FOREIGN PATENT DOCUMENTS

| DE | 19521150 | 12/1995 | ......... H01L/23/522 |
| DE | 197 02 124 A1 | 1/1997 | |
| DE | 197 17 698 A1 | 4/1997 | |

(List continued on next page.)

OTHER PUBLICATIONS

T. Takewaki, T. Ohmi and T. Nitta, "A Novel Self–Aligned Surface–Silicide Passivation Technology for Reliability Enhancement in Copper Interconnects", 1995 Symposium on VLSI Technology Digest of Technical Papers, pp. 31–32.

(List continued on next page.)

*Primary Examiner*—David Nelms
*Assistant Examiner*—David Vu
(74) *Attorney, Agent, or Firm*—Moser, Patterson & Sheridan

(57) ABSTRACT

A method and apparatus for reducing oxidation of an interface of a semiconductor device thereby improving adhesion of subsequently formed layers and/or devices is disclosed. The semiconductor device has at least a first layer and a second layer wherein the interface is disposed between said first and second layers. The method includes the steps of providing the first layer having a partially oxidized interface; introducing a hydrogen-containing plasma to the interface; reducing the oxidized interface and introducing second-layer-forming compounds to the hydrogen-containing plasma. A concomitant apparatus (i.e., a semiconductor device interface) has a first insulating layer, one or more conductive devices disposed within the insulating layer, the insulating layer and conductive devices defining the interface, wherein the interface is treated with a continuous plasma treatment to remove oxidation and deposit a second layer thereupon. The insulating layer of the interface is selected from oxides and nitrides and is preferably a nitride.

5 Claims, 3 Drawing Sheets

U.S. PATENT DOCUMENTS

| | | | |
|---|---|---|---|
| 5,288,527 A | 2/1994 | Jousse et al. | 427/579 |
| 5,409,543 A | 4/1995 | Panitz et al. | 134/2 |
| 5,420,044 A | 5/1995 | Kozuka | 437/4 |
| 5,441,768 A | 8/1995 | Law et al. | 427/255.7 |
| 5,451,263 A | 9/1995 | Linn et al. | 134/1.1 |
| 5,458,907 A | 10/1995 | Ishido | 427/96 |
| 5,599,736 A * | 2/1997 | Tseng | 438/659 |
| 5,725,938 A | 3/1998 | Jin et al. | 428/210 |
| 5,726,097 A | 3/1998 | Yanagida | 438/622 |
| 5,780,163 A | 7/1998 | Camilletti et al. | 428/446 |
| 5,801,098 A | 9/1998 | Fiordalice et al. | 438/653 |
| 5,834,371 A | 11/1998 | Ameen et al. | 438/656 |
| 5,843,847 A | 12/1998 | Pu et al. | 438/723 |
| 5,899,720 A | 5/1999 | Mikagi | 438/303 |
| 5,950,083 A | 9/1999 | Inoue et al. | 438/233 |
| 5,970,378 A | 10/1999 | Shue et al. | 438/656 |
| 6,013,574 A * | 1/2000 | Hause et al. | 438/622 |
| 6,033,537 A | 3/2000 | Suguro | 204/192.2 |
| 6,071,813 A * | 6/2000 | Nogami | 438/687 |
| 6,143,640 A * | 11/2000 | Cronin et al. | 438/618 |
| 6,172,421 B1 * | 1/2001 | Besser et al. | 257/647 |
| 6,174,810 B1 * | 1/2001 | Islam et al. | 438/622 |
| 6,251,775 B1 | 6/2001 | Armbrust et al. | 438/644 |
| 6,303,505 B1 * | 10/2001 | Ngo et al. | 438/626 |
| 6,319,728 B1 * | 11/2001 | Bhan et al. | 438/680 |
| 6,355,571 B1 | 3/2002 | Huang et al. | 438/706 |

FOREIGN PATENT DOCUMENTS

| | | | |
|---|---|---|---|
| DE | 19751785 | 5/1998 | H01L/21/768 |
| EP | 0 416 400 A1 | 3/1991 | |
| EP | 0630989 | 6/1994 | C23C/16/44 |
| EP | 0 630 989 | 12/1994 | C23C/16/44 |
| EP | 0 684 671 A1 | 11/1995 | |
| EP | 0 780 485 A1 | 6/1997 | |
| EP | 0849779 | 6/1998 | H01L/21/306 |
| FR | 2 775 986 | 3/1998 | |
| GB | 2155862 | 10/1985 | C23C/16/44 |
| GB | 2290166 | 12/1995 | H01L/21/3213 |
| GB | 2319532 | 5/1998 | C23C/14/58 |
| GB | 2319533 | 5/1998 | C23C/14/58 |
| JP | 61000579 | 1/1986 | |
| JP | 04072724 | 3/1992 | |
| JP | 04273442 | 9/1992 | |
| JP | 06204191 | 7/1994 | |
| JP | 06097111 | 8/1994 | H01L/21/28 |
| JP | 07201738 | 8/1995 | |
| JP | 07201749 | 8/1995 | |
| WO | WO 93/17453 | 3/1993 | |

OTHER PUBLICATIONS

Sawada, et al., "The reduction of copper oxide thin films with hydrogen plasma generated by an atmospheric–pressure glow discharge," *J. Phys. Appl. Phys.* 29 (1996), pp. 2539–2544.

A Darchen, R Drissi–Daoudi, A Irzho, "Electrochemical Investigations of Copper Etching by Cu $(NH_3)_4$ $Cl_2$ in Ammoniacal Solutions", Journal of Applied Electrochemistry, 1997, 27 (4), 448–454.

S. S. Wong, C. G. Sodini, T. W. Ekstedt, H. R. Grinolds, K. H. Jackson, and S. H. Kwan, "Low Pressure Nitrided–Oxide as a Thin Gate Dielectric for MOSFETl's," vol. 130, No. 5, pp. 1139–1144.

Takashi Ito, Takao Nozaki, and Hajime Ishikawa, "Direct Thermal Nitridation of Silicon Dioxide Films in Anhydrous Ammonia Gas," J. Electrochem. Soc., vol. 127, No. 9, pp. 2053–2057.

Richard Swope, Woo Sik Yoo, Julian Hsieh, Shari Shuchmann, Ferenc Nagy, Harald te Nijenhuis, and David Mordo, "Improvement of Adhesion Properties of Fluorinated Silica Glass Films by Nitrous Oxide Plasma Treatment," J. Electrochem. Soc., vol. 144, No. 7, Jul. 1997, pp. 2559–2564.

S. Takeishi, H. Kudah, R. Shinohara, A. Tsukume, Y. Satoh, H. Miyazawa, H. Harada, and M. Yamada, Stabilizing Dielectric Constants of Fluorine–Doped $SiO_2$ Films by $N_2O$–Plasma Annealing, J. Electrochem. Soc., vol. 143, No. 1, Jan. 1996, pp. 381–384.

K. Mikagi, H. Ishikawa, T. Usami, M. Suzuki, K. Inoue, N. Oda, S. Chikaki, I. Sakai and T. Kikkawa, Barrier Metal Free Copper Damascence Interconnection Technology Using Atmospheric Copper Reflow and Nitrogen Doping in SiOF Film, 8 1996 IEEE, IEVM 96, 365–368, pp. 14.5.1–14.5.4.

Kazuo Kanehiro, et al. "Cleaning of copper of copper alloy for dry coating"; Chemical Abstracts, vol. 107, No. 26, p. 83; Dec. 28, 1987.

Research Disclosure XP000099373, "Low Temperature Process for Surface Cleaning", No. 309, p. 82, Jan. 1, 1990.

S. Hymes, et al. "Surface Cleaning of Copper by Thermal and Plasma Treatment in Reducing and Inert Ambients", 1 Vac. Sci Technol. vol. 16, No. 3 May/Jun. 1998; pp;. 1107–1109.

PCT International Search Report dated Apr. 6, 2000.

\* cited by examiner

SEMICONDUCTOR DEVICE HAVING REDUCED OXIDATION INTERFACE

CROSS-REFERENCE TO RELATED APPLICATIONS

This application is a divisional of application Ser. No. 09/365,129 filed Jul. 30, 1999 which is a continuation-in-part of commonly assigned and copending application Ser. No. 09/193,920 filed Nov. 17, 1998, both of which are herein incorporated by reference.

BACKGROUND OF THE DISCLOSURE

1. Field of the Invention

The invention relates to the fabrication of semiconductor devices and, more particularly, the invention relates to a method and apparatus for reducing the likelihood of oxidation of conductive material in a semiconductor device during its fabrication.

2. Description of the Background Art

Integrated circuits fabricated on semiconductor substrates for Ultra Large Scale Integration (ULSI) require multiple levels of conductive interconnections for electrically connecting the discrete semiconductor devices that comprise the circuits. Conventionally, the multiple levels of interconnections are separated by layers of insulating material. These interposed insulating layers have etched via holes which are used to connect one level of interconnections to another. Typically, the conductive interconnection material is aluminum, titanium, tungsten or tantalum. As device dimensions decrease and the device density increases, it is necessary to use conductive materials having lower levels of resistivity such as copper.

A well known method for creating integrated circuits such as those described above is by chemical vapor deposition (CVD). Typically, a precursor gas is mixed with a carrier gas and introduced to a deposition chamber at an elevated temperature. Upon contact with a substrate (i.e., a semiconductor wafer) within the chamber, the precursor gas decomposes into various elements and reacts with the surface to create the desired material (insulative layer, typically an oxide or conductive material such as copper). Such processes may also be enhanced by the use of a plasma within the chamber which provides for a more uniform deposition process, i.e., when filling an opening in an oxide layer with conductive material. However, deficiencies in the CVD process create undesirable results. It has been found that between the time that a conductive material is deposited upon the substrate and an insulative or barrier layer is deposited over the conductive material, the conductive material is subjected to an oxidation reduction reaction. For example, the topmost exposed surface of a copper interconnect is reduced to copper oxide. Such surface oxides inhibit the adhesion of further material layers that are deposited thereover.

One particular method known in the art for removing native oxides from conductive interconnects is by sputtering. That is, the interconnect is exposed to a highly energetic plasma form of an inert gas (i.e., argon, xenon or the like). The highly energetic molecules of the plasma strike the oxidized surface thereby striping or sputtering away the oxide molecules. However, due to the physical nature of the sputtering act, it is difficult to prevent sputtering of small amounts of deposited copper also. Sputtering copper is undesirable because it removes required conductive material from the interconnect and it also causes cross contamination in the process chamber. Cross contamination is the condition whereby material other than what is specifically being deposited is also incorporated into a layer. For example, a partially formed semiconductor device is subjected to a sputtering step in a process chamber for removal of copper oxide from its copper interconnect. During this step, copper is also sputtered and inadvertently released into the chamber. In a following insulative layer deposition step occurring in the same chamber, the sputtered copper is deposited into the insulative layer causing cross contamination. Cross contamination may also be a condition whereby the sputtered copper is carried to other process chambers of a semiconductor wafer process system. In either situation, cross contamination is not a desirable aspect of the semiconductor device fabrication process.

Since physical sputtering is not an optimal solution, chemical removal of the native oxide is considered. One particular chemical removal method known to those skilled in the art includes the use of a hydrogen-based plasma. For example, a first plasma is formed of a hydrogen based, chemically reactive species such as ammonia ($NH_3$) or hydrogen ($H_2$). The reactive species chemically reacts with and reduces the oxide to form copper (Cu) and byproducts (i.e., water (H2O) and hydroxide (OH)). These byproducts are then pumped out of the process chamber and the plasma is turned off to conclude the reduction process. Subsequently, nitride forming gases i.e., a mixture of silane $SiH_4$, ammonia $NH_3$ and nitrogen $N_2$ are introduced to form a second plasma suitable for CVD of nitride. Unfortunately, adhesion is also adversely affected during this process because the silane reacts with residual water or hydroxide that was not evacuated from the chamber. Such a reaction causes an undesirable hazy film to form over the conductive interconnect. Additionally, the copper and silane thermally react to form copper silicides (CuSix) when the plasma is turned off in preparation for the next process step. Either of these films are undesirable for further deposition.

Therefore, there is a need in the art for a method of semiconductor device construction that reduces the amount of native oxide formation on the conductive material used to form the device.

SUMMARY OF THE INVENTION

The disadvantages associated with the prior art are overcome with the present invention of a method for reducing oxidation of an interface of a semiconductor device. The semiconductor device has at least a first layer and a second layer wherein the interface is disposed between said first and second layers. The method includes the steps of providing the first layer having a partially oxidized interface; introducing a hydrogen-containing plasma to the interface; and introducing second-layer-forming compounds to the hydrogen-containing plasma thereby forming a continuous plasma treatment of reduction/deposition upon the interface. The first layer further includes an insulating material having one or more conductive material devices disposed therein and the interface is defined as a generally uniform surface where the insulating material and the conductive material coincide. The conductive material makes up the oxidation of the interface. The method further comprises introducing ammonia to the interface for the step of introducing the hydrogen-containing plasma step. Such ammonia is introduced at a flow rate of approximately 50–300 sccm; the hydrogen-containing plasma is energized with a power of approximately 50–500 W and the step is performed for approximately 2–200 seconds. In a preferred embodiment of the invention, the ammonia flow rate is 75 sccm, plasma power is 150 W and the step is performed for 10 seconds.

The step of introducing second-layer-forming compounds to the hydrogen-containing plasma further comprises for example introducing silane to the interface. Such silane is introduced at a flow rate of approximately 220 sccm; the hydrogen-containing, second-layer-forming-compound introduced plasma is energized with a power of approximately 460 W and the step is performed for approximately 9 seconds. Additionally, the first two steps of the method may be performed in a first process chamber and the third step may be performed in a second process chamber instead of conducting all of the steps of the method solely in one process chamber.

An apparatus (i.e., a semiconductor device interface) in accordance with the invention comprises a first insulating layer, one or more conductive devices disposed within the insulating layer, the insulating layer and conductive devices defining the interface, wherein the interface is treated with a continuous plasma treatment to remove oxidation and deposit a second layer thereupon. The insulating layer of the interface is selected from oxides and nitrides and is preferably a nitride. The conductive material of the interface is selected from titanium, tantalum, tungsten and copper and is preferably copper. The second layer of the interface is an insulating layer that is preferably is composed of a nitride formed from plasma-enhanced CVD of silane, ammonia and nitrogen.

With the method and apparatus described in the subject invention, a reduction in the amount of oxidized material on a semiconductor device interface is realized. As such, subsequently formed layers have greater adhesion and the integrity and quality of devices formed from such layers is improved.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
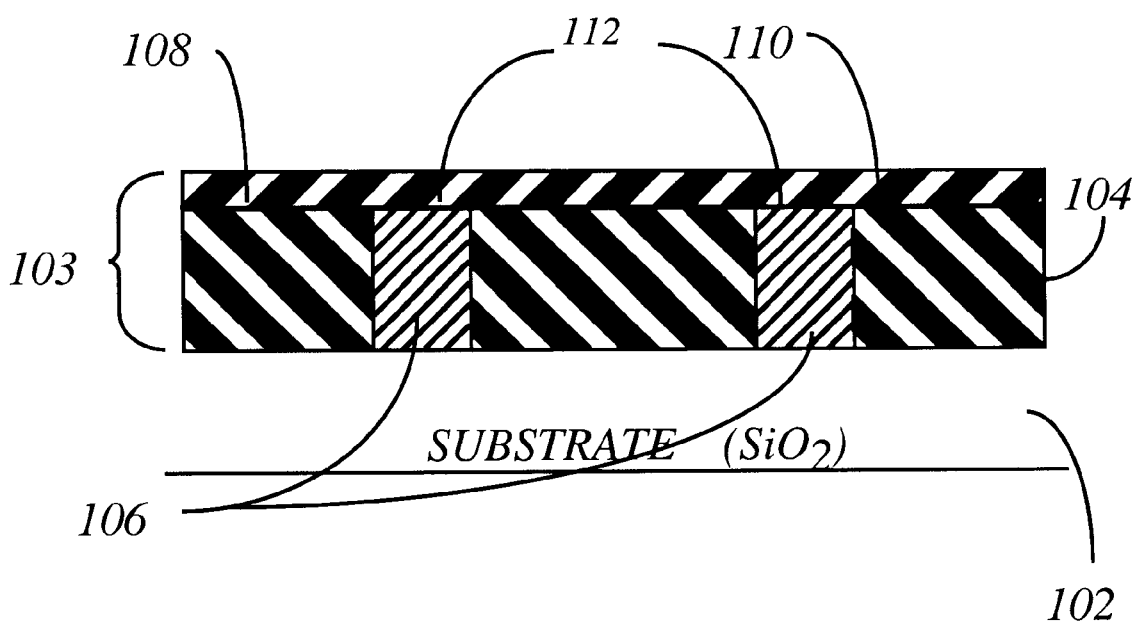
FIG. 1 depicts a partial cross sectional view of a semiconductor substrate having an integrated circuit constructed thereupon in accordance with the subject invention.

FIG. 1 depicts a partially formed integrated circuit device 100 in accordance with the subject invention. The device 100 is comprised of a substrate material 102 (typically a dielectric material such as $SiO_2$) having a plurality of layers 103 of various materials disposed thereupon. The various layers have different electrical properties so as to create conductive pathways, circuit devices, and the like. These pathways and devices are linked to other devices on the substrate via a variety of other lines, interconnects and devices (not shown). For example, a first layer 104 is an insulating layer disposed on top of the substrate 102 acting as a primary insulator. Such layer is made of dielectric materials selected from the group consisting of silicon dioxide, silicon nitride, silicon carbide, oxides and low k materials such as BLACK DIAMOND™ having a value of approximately 2.4–3.0. BLACK DIAMOND™ is a trademark of Applied Materials, Inc. of Santa Clara, Calif. Other types of insulating materials known to those skilled in the art may also be used to form the first insulating layer 104. Within the insulating layer 104 are various circuit pathways or circuit devices 106 comprised of conductive material such as aluminum, titanium, tungsten, tantalum and preferably copper. Disposed above the insulating layer 104 and conductive circuit pathway or devices 106 is a second insulative layer 108. Typically, the second insulative layer 108 is a dielectric material such as the aforementioned materials but not necessarily the same material as the first dielectric layer 104.

An interface 110 is defined as the generally uniform surface where the conductive pathways (devices) 106 and insulating layer 104 meet. A portion 112 of this interface 110 is made up by the conductive pathway (device) 106 and as such is subject to oxidation prior to the deposition of the second insulative layer 108. In accordance with the subject invention and specifically with respect to the method steps described below, the interface portion 112 is treated so as to greatly reduce the amount of oxidation. Accordingly, the second insulative layer 108 is deposited upon the interface 110 with greater adhesion and overall product integrity and reliability.

Figure 2:
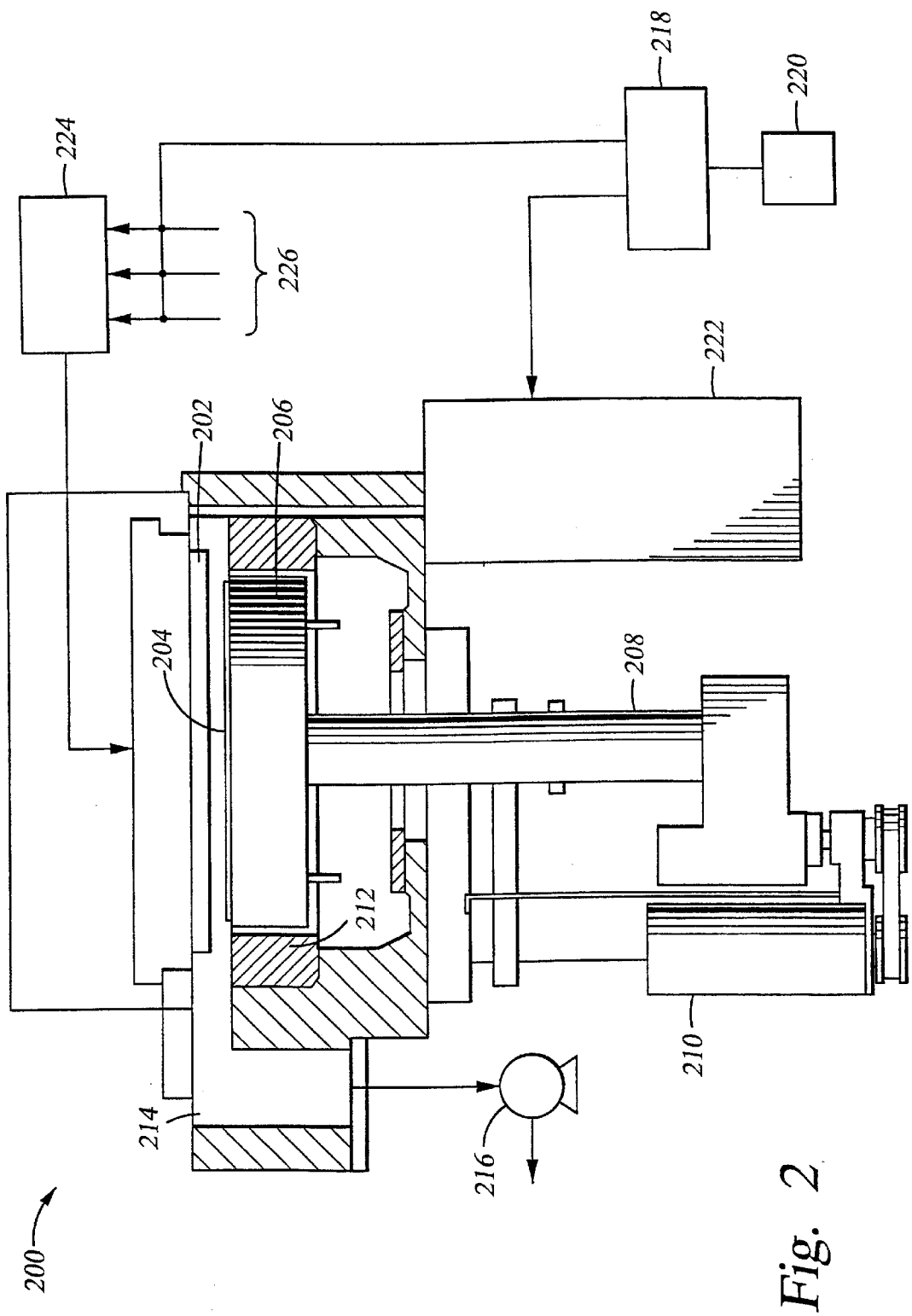
FIG. 2 depicts a schematic view of a deposition system used in conjunction with the subject invention.

The integrated circuit device 100 is formed by a process selected from the group consisting of chemical vapor deposition (CVD) and plasma-enhanced chemical vapor deposition (PECVD). CVD/PECVD and an apparatus for performing same is disclosed in U.S. Pat. No. 5,000,113 and is herein incorporated by reference. FIG. 2 is a cross-sectional view of a CVD plasma reactor 200 in which the above plasma reducing process may be performed. Such a reactor may be part of the CENTURA DxZ platform that is manufactured and sold by Applied Materials, Inc. of Santa Clara, Calif. The present invention could be used in other reactors, such as a lamp heated reactor. Reactor 200 contains a gas distribution manifold 202, which may be a showerhead, for dispersing process gases through perforated holes (not shown) in the manifold to a substrate or wafer 204 that rests on a substrate support plate or susceptor 206. The manifold 202 is connected to a gas panel 224. The gas panel 224 is likewise connected to a plurality of process and carrier gas sources 226. Each of the gas sources 226 is connected to a system controller 218. The system controller 218 and attendant memory 220 control the activities of the reactor 200. For example, according to the particular process being performed, the controller 218 will send signals to release the appropriate gases at the appropriate flow rates to the gas panel 224. The gas panel receives and mixes the gases for distribution to the manifold 202.

Susceptor 206 is resistivity heated and is mounted on a support stem 208, so that susceptor 206 and the wafer 204 supported on the upper surface of susceptor 206 can be controllably moved by a lift motor 210 between a lower loading/off-loading position and an upper processing position, which is spaced closely adjacent to the manifold 202. When susceptor 206 and the wafer 204 are in the processing position, they are surrounded by an insulator ring 212. During processing, gases inlet to manifold 202 are uniformly distributed radially across the substrate surface. The gases exhaust through a port 214 by a vacuum pump system 216.

The deposition process performed in reactor 200 can be either a thermal process or a plasma enhanced process. In a plasma process, a controlled plasma is formed adjacent to the wafer by RF energy applied to distribution manifold 202 from RF power supply 222 with susceptor 206 grounded. Gas distribution manifold 202 is also an RF electrode, while susceptor 206 is grounded. RF power supply 222 can supply either single or mixed frequency RF power to manifold 202 to enhance the decomposition of any reactive species introduced into chamber 200. A mixed frequency RF power supply typically supplies power at a high RF frequency (RF1) of 13.56 MHz and at a low RF frequency (RF2) of 350 kHz.

With the present invention, the above chamber can be used to plasma treat an interface (i.e., reduce an oxide with a reducing agent and particularly a copper oxide with ammonia) and then continuously deposit a second layer upon the interface. The reducing agent can be introduced through manifold 202 and be uniformly distributed radially across the wafer surface for the plasma reducing process in the manner described above, followed by the gases exhausting through the port 214. Likewise, the gases necessary to deposit the second layer can be introduced through the manifold 202 without extinguishing the previously formed plasma. That is, the deposition gases alter the characteristics of the plasma thereby allowing for deposition in a seamless manner immediately after reduction.

Figure 3:
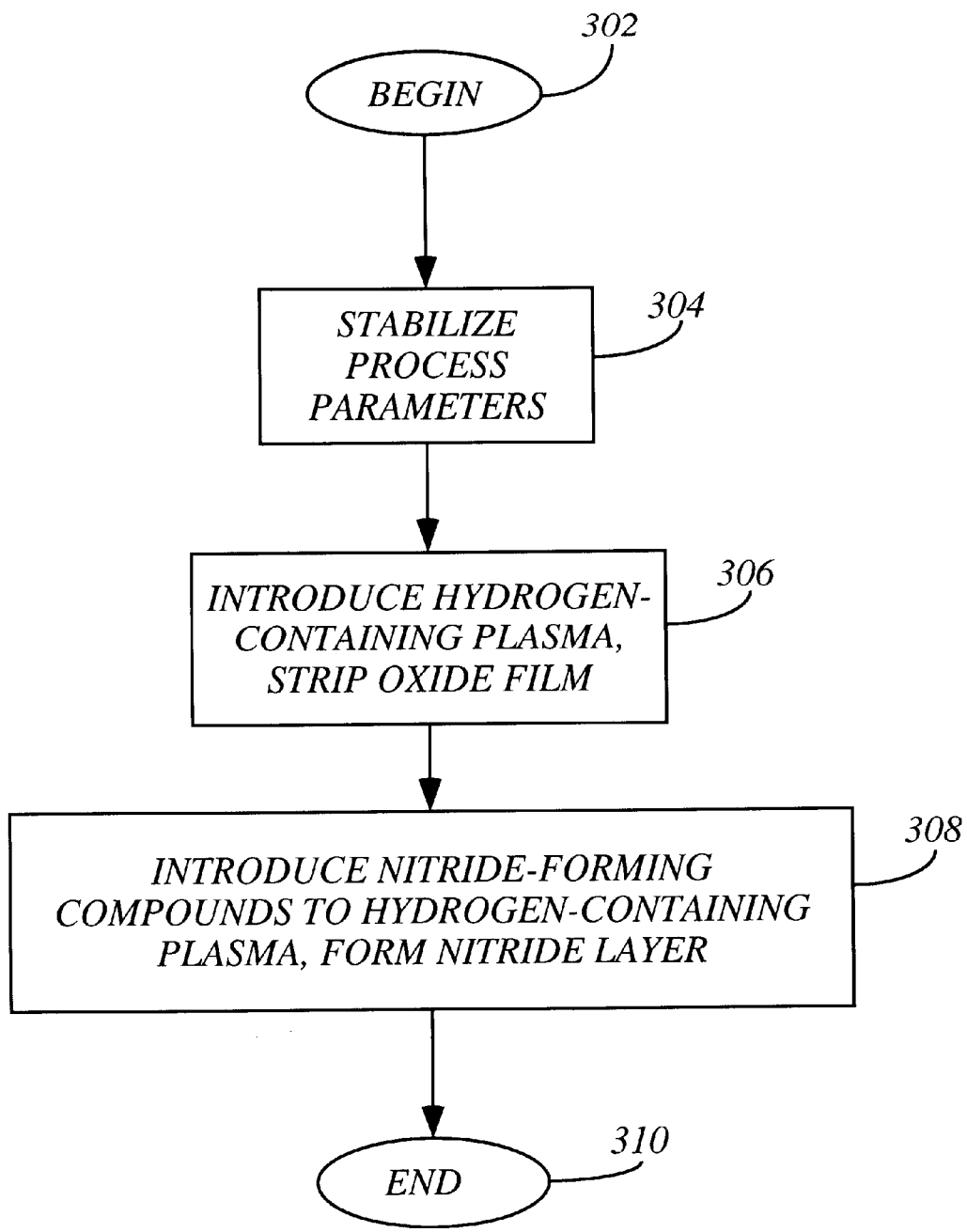
FIG. 3 depicts a series of method steps of the present invention.

The subject invention also includes a method for forming a semiconductor device with a reduced oxidation interface. Specifically, FIG. 3 depicts a series of method steps 300 in accordance with subject invention. The method begins at step 302 and proceeds to step 304 where a stabilization of one or more process parameters is performed. Specifically, conditions such as temperature, pressure, substrate to showerhead spacing and process gas flows are stabilized within a process chamber (i.e., chamber 202). In a preferred embodiment of the invention, the stabilization step 302 is performed for approximately 5–60 seconds, and preferably 15 seconds to attain a process temperature of approximately 400° C., a process pressure of approximately 2.0–6.0 Torr, and preferably 4.2 Torr, a substrate to showerhead spacing of approximately 250–650 mils and preferably 350 mils and a nitrogen gas ($N_2$) flow of approximately 2,000–20,000 sccm and preferably 5,000 sccm. At step 306, a hydrogen containing plasma is introduced to the substrate containing the oxidized interface portions 112. The hydrogen containing plasma chemically reacts with the oxidized interface portions 112 to remove such oxidation and restore the interface portion 112 to its original conductive characteristics. The hydrogen containing plasma is preferably formed from a flow of ammonia ($NH_3$) or hydrogen ($H_2$) gas exposed to an appropriate energy source (i.e., DC power source 228). Step 306 is conducted for approximately 5–60 seconds and preferably 10 seconds at a temperature of 400° C., a pressure of approximately 2.0–6.0 Torr and preferably 4.2 Torr, a substrate to showerhead spacing of 350 mils and RF power of approximately 50–500 watts and preferably 150 watts and ammonia ($NH_3$) or hydrogen ($H_2$) gas flow of approximately 50-3,000 sccm and preferably 75 ccm and a nitrogen gas ($N_2$) flow rate of approximately 2,000–20,000 sccm and preferably 5,000 sccm.

Immediately upon conclusion of step 306, step 308 occurs in which one or more insulator forming compounds are introduced to the hydrogen containing plasma to form an insulating layer. The insulating layer is in effect the second insulative layer 108 of the device 100. Moreover, step 308 is carried out "in-situ," that is, in the same chamber as the previous steps so as to reduce the likelihood of cross-contamination. The second insulative layer need not be fabricated of the same materials as the first insulative layer. Further the second insulative layer may be a plurality of layers formed by a plurality of different process parameters known to those skilled in the art. The following disclosure is exemplary in nature and should not be considered as restricting the scope of the invention. Preferably, the insulator forming compounds are nitride forming compounds which are selected from the group consisting of silane ($SiH_4$), ammonia ($NH_3$) and nitrogen ($N_2$). In a preferred embodiment of the invention, step 308 occurs for approximately 9 seconds at a temperature of 400° C., a pressure of approximately 2.0–6.0 Torr and preferably 4.2 Torr, a substrate to showerhead spacing of approximately 250–650 mils and preferably 550 mils, an RF power of approximately 200–1,000 watts and preferably 460 watts, a silane ($SiH_4$) flow rate of approximately 220 sccm, an ammonia ($NH_3$) flow rate of approximately 50–3,000 sccm and preferably 75 sccm and a nitrogen ($N_2$) flow rate of approximately 2,000–20,000 and preferably 5,000 sccm. The method ends at step 310. Table 1 displays an alternate set of process parameters for $NH_3$ plasma only in both steps 306 and 308.

TABLE 1

Alternate Process Parameters for $NH_3$ Plasma

| | | General | Preferred | Most Preferred |
|---|---|---|---|---|
| $NH_3$ Plasma (Step 306) | Flow (sccm) | 25–1000 | 25–300 | 25–100 |
| | Pressure (Torr) | 1–10 | 3–7 | 4–6 |
| | Temp (° C.) | 100–500 | 200–400 | 300–400 |
| | Spc. (mils) | 200–600 | 300–500 | 300–400 |
| | Power (watts) | 100–1000 | 100–500 | 100–400 |
| Nitride (Step 308) | Flow (sccm) | 25–1000 | 25–300 | 25–100 |
| | Pressure (Torr) | 1–10 | 3–7 | 4–6 |
| | Temp (° C.) | 100–500 | 200–400 | 300–400 |
| | Spc. (mils) | 200–600 | 200–600 | 400–600 |
| | Power (watts) | 100–1000 | 100–500 | 200–400 |

The benefits of the subject invention are realized in that oxidation of the interface portion that is conductive is greatly reduced as a result of a chemical reaction. As such, layers deposited thereover have a greater likelihood of adhesion than previously possible with untreated layers or layers treated but still having residual byproducts remaining. Additionally, with a continuous plasma being used, the possibility of copper suicide formation is greatly reduced. That is, copper suicides form when silane is allowed to thermally react at the substrate surface (which contains copper at the interface portions 112). With the back-to-back plasma feature of the subject invention, the silane is broken down into Si and H which allows the nitride to form on the interface before copper silicide can form. Additionally, since the entire process is carried out "in-situ," there are greatly reduced cross-contamination issues.

Although various embodiments which incorporate the teachings of the present invention have been shown and described in detail herein, those skilled in the art can readily devise many other varied embodiments that still incorporate these teachings.

What is claimed is:

1. A semiconductor device comprising:
   an interface defined by a first insulating layer and one or more conductive pathways disposed within said layer, the interface having oxidation reduced portions; and
   a second insulating layer disposed upon said interface coincident with removal of said oxidation reduced portions.

2. The semiconductor device of claim 1 wherein the first insulating layer is selected from a group consisting of oxides and nitrides.

3. The semiconductor device of claim 1 wherein the conductive pathways comprise metals selected from a group consisting of titanium, tantalum, tungsten and copper.

4. The semiconductor device of claim 1 wherein the second insulating layer is selected from a group consisting of oxides and nitrides.

5. The semiconductor device of claim 1 wherein the second insulating layer is formed and oxidation reduced portions are removed using a plasma-enhanced process.

* * * * *